United States Patent
Kim et al.

(10) Patent No.: US 10,128,120 B2
(45) Date of Patent: Nov. 13, 2018

(54) METHOD OF TREATING A LAYER

(71) Applicant: Samsung Electronics Co., Ltd., Suwon-si, Gyeonggi-do (KR)

(72) Inventors: Kwangsu Kim, Seoul (KR); Byoung Jae Park, Hwaseong-si (KR); Yongsun Ko, Suwon-si (KR); Kyunghyun Kim, Seoul (KR); ChangSup Mun, Suwon-si (KR); Kijong Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 115 days.

(21) Appl. No.: 15/242,190

(22) Filed: Aug. 19, 2016

(65) Prior Publication Data

US 2017/0125254 A1 May 4, 2017

(30) Foreign Application Priority Data

Oct. 30, 2015 (KR) .................... 10-2015-0152006

(51) Int. Cl.
*H01L 21/3065* (2006.01)
*H01L 21/02* (2006.01)
*H01L 21/311* (2006.01)
*H01L 21/3213* (2006.01)

(52) U.S. Cl.
CPC .... *H01L 21/3065* (2013.01); *H01L 21/02057* (2013.01); *H01L 21/31116* (2013.01); *H01L 21/32136* (2013.01); *H01L 21/32137* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,318,588 | B2 * | 11/2012 | Imahayashi | ....... H01L 21/02024 438/459 |
| 8,853,089 | B2 * | 10/2014 | Ohtsuki | ............ H01L 21/30604 438/700 |
| 8,895,449 | B1 | 11/2014 | Zhu et al. | |
| 2006/0102197 | A1 | 5/2006 | Chiang et al. | |
| 2014/0116470 | A1 | 5/2014 | Su et al. | |
| 2014/0179106 | A1 | 6/2014 | Zhong et al. | |

FOREIGN PATENT DOCUMENTS

| | | |
|---|---|---|
| JP | 2002-025991 A | 1/2002 |
| JP | 2007-305730 A | 11/2007 |
| KR | 10-0629355 B1 | 9/2006 |
| KR | 10-2006-0116482 A | 11/2006 |
| KR | 10-2007-0086312 A | 8/2007 |
| KR | 10-2009-0038066 A | 4/2009 |
| KR | 10-0955266 B1 | 4/2010 |
| KR | 10-1423554 B1 | 7/2014 |

* cited by examiner

*Primary Examiner* — Ratisha Mehta
(74) *Attorney, Agent, or Firm* — Myers Bigel, P.A.

(57) ABSTRACT

The inventive concepts provide a method of completely removing a damage region of a surface of an etch target layer after plasma-etching the etch target layer. The method includes performing a first post-etch plasma treatment process using a first post-treatment gas on the plasma-etched etch target layer. A polarity of ions of the first post-treatment gas may be the same as a polarity of bias power applied to a stage in a plasma apparatus.

20 Claims, 12 Drawing Sheets

METHOD OF TREATING A LAYER

CROSS-REFERENCE TO RELATED APPLICATION

This U.S. non-provisional patent application claims priority under 35 U.S.C. § 119 to Korean Patent Application No. 10-2015-0152006, filed on Oct. 30, 2015, in the Korean Intellectual Property Office, the disclosure of which is hereby incorporated herein by reference in its entirety.

FIELD

The inventive concepts relate to a method of treating a layer and, more particularly, to a method of treating a layer, which includes a post-etch treatment process performed after a plasma etching process.

BACKGROUND

Semiconductor devices are widely used in electronic industries because of their small sizes, multi-functional characteristics, and/or low manufacturing costs. However, as semiconductor devices have been highly integrated, various problems have arisen. For example, as semiconductor devices have become highly integrated, widths and/or spaces of patterns in semiconductor devices have been reduced, but heights and/or aspect ratios of the patterns also have increased. Accordingly, semiconductor devices may be electrically and/or physically affected by contaminants generated during deposition processes and/or etching processes of layers, and thus the reliability of semiconductor devices may decrease.

SUMMARY

Embodiments of the inventive concepts may provide a method of treating a layer, which is capable of improving reliability and integration density of a device.

In an aspect, a method of treating a layer may include loading an etch target layer on a stage in a plasma apparatus, plasma-etching the etch target layer using an etching gas injected into the plasma apparatus, wherein a first damage region having a first thickness is generated on a surface of the plasma-etched etch target layer during the plasma-etching of the etch target layer, performing a first post-etch plasma treatment process using a first post-treatment gas to remove the first damage region, wherein a second damage region is generated on a surface of the etch target layer, from which the first damage region is removed, during the first post-etch plasma treatment process, performing a second post-etch plasma treatment process using a second post-treatment gas to damage the second damage region, and performing a cleaning process to remove the second damage region damaged by the second post-etch treatment process.

In some embodiments, a polarity of ions of the first post-treatment gas in a plasma state may be the same as a polarity of bias power applied to the stage during the first post-etch plasma treatment process.

In some embodiments, the plasma-etching, the first post-etch plasma treatment process, and the second post-etch plasma treatment process may be performed in-situ in the plasma apparatus.

In some embodiments, at least two of the plasma-etching, the first post-etch plasma treatment process, and the second post-etch plasma treatment process may be performed in-situ in the plasma apparatus.

In some embodiments, the first post-treatment gas may include a carbon-free gas.

In some embodiments, the first post-treatment gas may include $Cl_2$.

In some embodiments, the second post-treatment gas may include an inert gas.

In some embodiments, a third damage region may be generated under the damaged second damage region during the second post-etch plasma treatment process, and the second and third damage regions may be removed by the cleaning process.

In some embodiments, the cleaning process may include a strip process.

In some embodiments, the cleaning process may include at least one of a wet cleaning process or a dry cleaning process.

In some embodiments, the method may further include forming a conductive layer on the etch target layer after the performing of the cleaning process.

In some embodiments, the method may further include performing an epitaxial process on the etch target layer to form an epitaxial layer after the performing of the cleaning process.

In an aspect, a method of treating a layer may include loading an etch target layer on a stage in a plasma apparatus, plasma-etching the etch target layer using a fluorine-containing etching gas injected into the plasma apparatus, a first damage region formed on a surface of the plasma-etched etch target layer, the first damage region having a first thickness, performing a first post-etch plasma treatment process using a chlorine-containing gas to remove the first damage region, a second damage region formed on a surface of the etch target layer from which the first damage region is removed, the second damage region having a second thickness, performing a second post-etch plasma treatment process using an inert gas to damage the second damage region, and performing a cleaning process to remove the second damage region damaged by the second post-etch plasma treatment process. At least two of the plasma-etching, the first post-etch plasma treatment process, and the second post-etch plasma treatment process are performed in-situ in the plasma apparatus.

In some embodiments, a third damage region may be generated under the damaged second damage region during the second post-etch plasma treatment process, and the second and third damage regions may be removed by the cleaning process.

In some embodiments, the cleaning process may include at least one of a strip process, a wet cleaning process, or a dry cleaning process.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
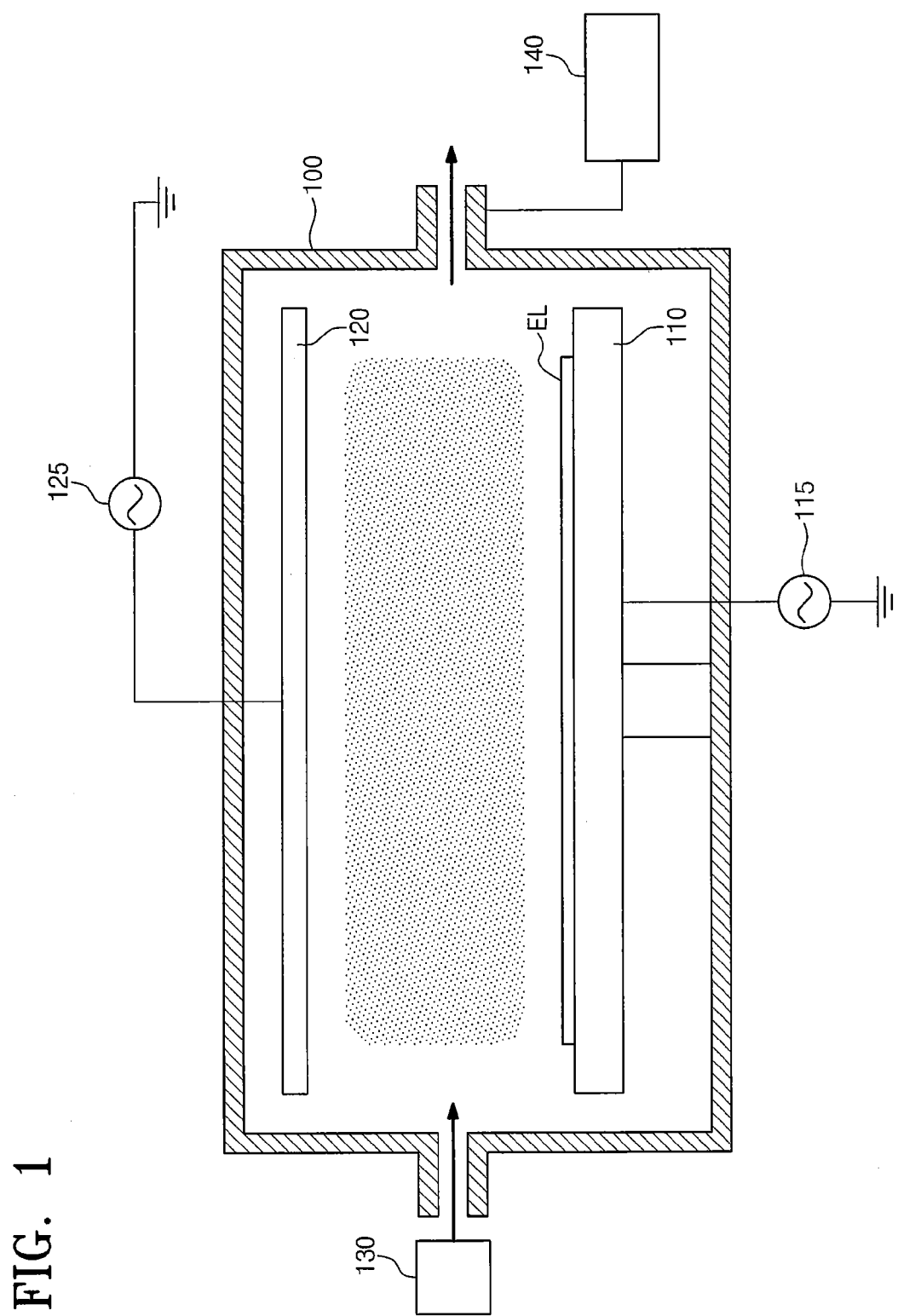
FIG. 1 is a cross-sectional view illustrating a plasma etching apparatus performing a plasma etching process.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

FIG. 1 is a cross-sectional view illustrating a plasma etching apparatus.

Referring to FIG. 1, a plasma etching apparatus may include a process chamber 100, a stage 110 on which an etch target layer EL is loaded, a plasma generating unit 120 and 125, a gas supply unit 130, and a gas exhaust unit 140.

The process chamber 100 may include a space into which an etching gas for forming plasma or an etching gas excited in a plasma state is provided.

The stage 110 may be disposed in the process chamber 100 and may support the etch target layer EL provided in the process chamber 100. Even though not shown in detail in the drawings, the stage 110 may be connected to a driving unit (not shown) so as to be vertically moved. In addition, a heater (not shown) may be installed in the stage 110 to adjust a temperature of the etch target layer EL during a plasma etching process.

The plasma generating unit 120 and 125 may include an upper electrode 120 disposed in an upper region of the space of the process chamber 100 to excite an etching gas provided in the process chamber 100 to a plasma state.

The upper electrode 120 may be connected to a radio-frequency (RF) generator 125, and one terminal of the RF generator 125 may be grounded. When a voltage is applied to the upper electrode 120, an electric field may be formed over the etch target layer EL by a voltage difference between the upper electrode 120 and the stage 110. The electric field formed by RF energy generated from the RF generator RF 125 may excite the etching gas to form the plasma state in which the etching gas is decomposed into electrons and ions etching the etch target layer EL.

To easily guide the excited plasma toward the etch target layer EL, a bias power unit 115 may be connected to the stage 110 having a lower electrode and supporting the etch target layer EL. In some embodiments, RF energy may be formed by the bias power unit 115.

The gas supply unit 130 may be connected to a side of the process chamber 100. The gas supply unit 130 may provide an etching gas into the process chamber 100. The etching gas provided in the process chamber 100 may be changed according to a kind of the etch target layer EL. In some embodiments, when the etch target layer EL includes silicon or poly-silicon, the etching gas may include at least one of $SF_6$, $CF_4$, $CF_4/H_2$, $CHF_3$, $CF_4/O_2$, HBr, $Cl_2$, or $Cl_2/HBr/O_2$. In some embodiments, when the etch target layer EL includes silicon oxide, the etching gas may include at least one of $SF_6$, $NF_3$, $CF_4$, $CF_4/H_2$, $CHF_3/O_2$, $CF_4/O_2$, $C_2H_6$, $C_3H_8$, or $CHF_3/C_4F_8/CO$. In some embodiments, when the etch target layer EL includes silicon nitride, the etching gas may include at least one of $CF_4/O_2$, $CF_4/H_2$, $CHF_3/O_2$, or $CH_2F_2$. In some embodiments, when the etch target layer EL includes aluminum (Al), the etching gas may include at least one of $Cl_2$, $Cl_2/CHCl_3$, or $Cl_2/N_2$. In some embodiments, when the etch target layer EL includes tungsten, the etching gas may include at least one of $SF_6$, $CF_4$, or $Cl_2$. In some embodiments, when etch target layer EL includes titanium or titanium nitride, the etching gas may include at least one of $Cl_2$, $Cl_2/CHCl_3$, or $CF_4$. In some embodiments, when the etch target layer EL includes titanium silicide, the etching gas may include at least one of $Cl_2$, $Cl_2/CHCl_3$, or $CF_4/O_2$.

The gas exhaust unit 140 may be connected to a side of the process chamber 100 and may include a vacuum valve (not shown) and a vacuum pump (not shown). In some embodiments, the gas exhaust unit 140 may adjust an inner pressure of the process chamber 100 and may exhaust etching by-products generated during the plasma etching process. To adjust the inner pressure of the process chamber 100 and/or to exhaust the etching by-products, the vacuum valve may be opened and the vacuum pump may be operated.

The plasma etching apparatus of FIG. 1 is illustrated as an example. However, embodiments of the inventive concepts are not limited to the plasma etching apparatus of FIG. 1.

Figure 2:
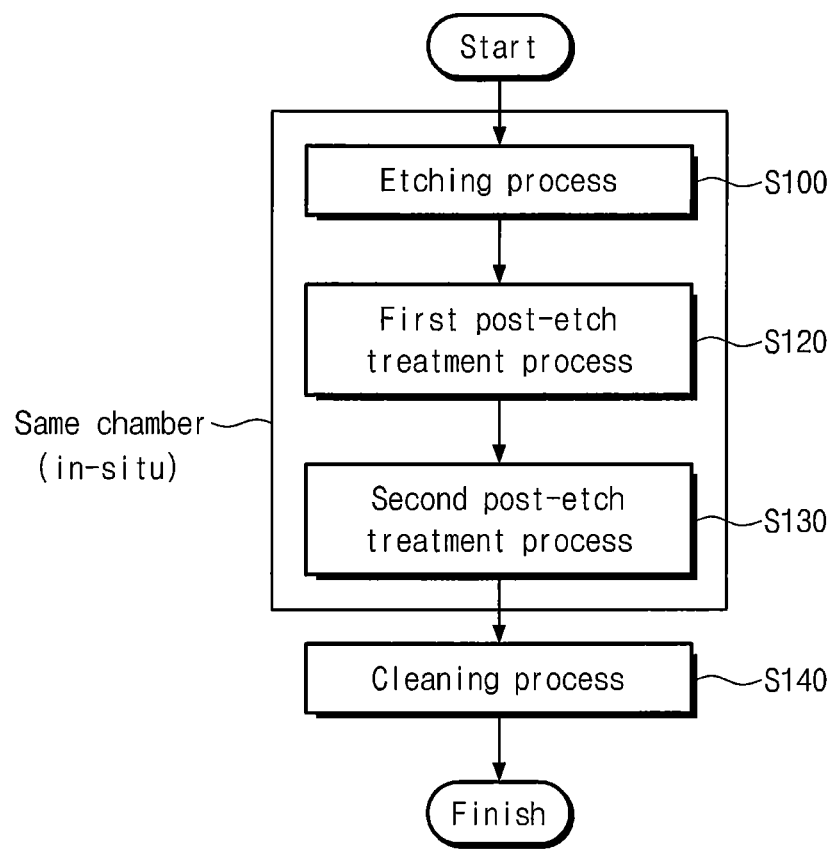
FIG. 2 is a flow chart illustrating a method of treating a layer, according to some embodiments of the inventive concepts.

FIG. 2 is a flow chart illustrating a method of treating a layer, according to some embodiments of the inventive concepts. FIGS. 3 to 9 are cross-sectional views illustrating a method of manufacturing a semiconductor device, according to some embodiments of the inventive concepts.

Figure 3:
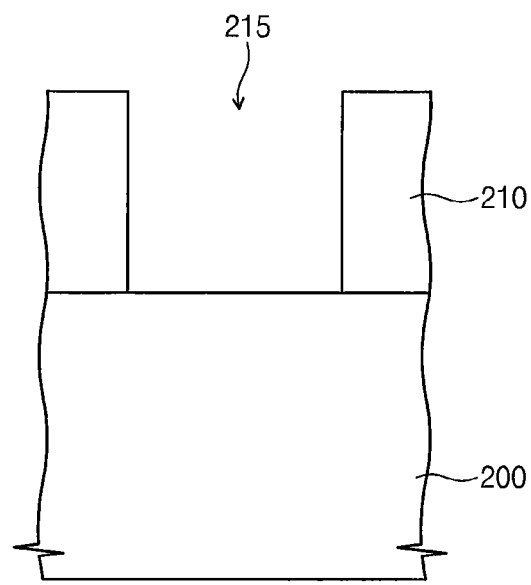
FIGS. 3 to 9 are cross-sectional views illustrating a method of manufacturing a semiconductor device, according to some embodiments of the inventive concepts.

Referring to FIG. 3, a mask pattern 210 may be formed on an etch target layer 200.

The mask pattern 210 may include an opening 215 exposing a portion of the etch target layer 200. In some embodiments, the opening 215 may have a hole shape or a linear shape extending in one direction. However, embodiments of the inventive concepts are not limited to the aforementioned shapes of the opening 215. In other words, the opening 215 may have one of other various shapes.

The etch target layer 200 may be at least a portion of a substrate, an insulating layer, and/or a conductive layer. In some embodiments, when the etch target layer 200 is a portion of the substrate, the substrate may be a semiconductor substrate including silicon and/or germanium, a silicon-on-insulator (SOI) substrate, or a germanium-on-insulator (GOI) substrate. In some embodiments, when the etch target layer 200 is the insulating layer, the insulating layer may include at least one of silicon oxide, silicon nitride, or silicon oxynitride. In some embodiments, when the etch target layer 200 is the conductive layer, the conductive layer may include at least one of doped poly-silicon, aluminum, tungsten, titanium, titanium nitride, or titanium silicide.

The mask pattern 210 may include a material having an etch selectivity with respect to the etch target layer 200. For example, the mask pattern 210 may include a photoresist material or an insulating material (e.g., silicon nitride).

Figure 4:
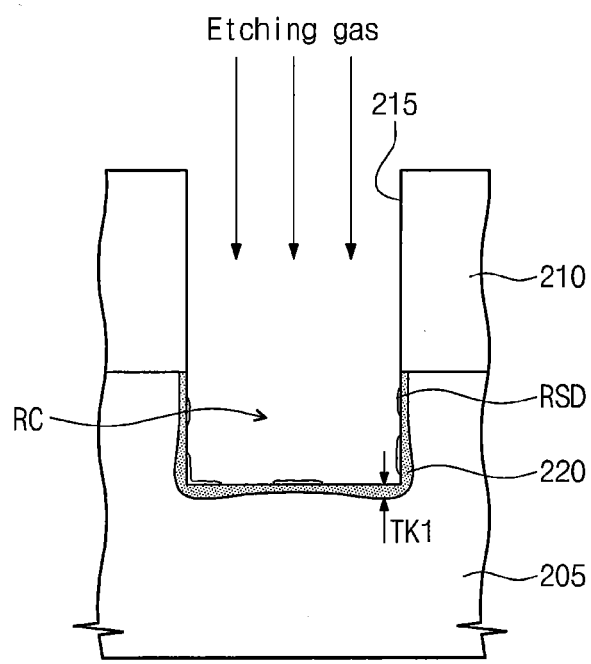

Referring to FIGS. 2 and 4, the etch target layer 200 may be etched using the mask pattern 210 as an etch mask to form a pattern structure 205 (S100). The pattern structure 205 may include a recess region RC.

According to some embodiments of the inventive concepts, etching the etch target layer 200 may be performed by an anisotropic etching process using plasma. The anisotropic etching process may be performed using the plasma etching apparatus illustrated in FIG. 1.

A reaction gas (i.e., the etching gas) in the plasma state may anisotropically etch the etch target layer 200 exposed through the opening 215, and thus a surface of the recess region RC of the completed pattern structure 205 may be damaged by the plasma. A degree of damage by the plasma may vary according to a position in the damaged portion. In some embodiments, as illustrated in FIG. 4, the degree of the damage of a bottom surface of the recess region RC may be greater than that of a sidewall of the recess region RC, and the greatest degree of the damage may occur at a corner portion of the recess region RC, at which the bottom surface meets the sidewall. Hereinafter, for the purpose of ease and convenience in explanation, a thickness of a portion of which the degree of the damage is the greatest may be defined as a thickness of the damaged region. In other words, a thickness of the thickest portion of the damaged region may be defined as the thickness of the damaged region. Hereinafter, the thickness of the region damaged by the etching process may be defined as a first thickness TK1, and the region damaged by the etching process may be defined as a first damage region 220. Bonds between atoms and/or molecules may be weak or broken in the first damage region 220. In other words, the bonds in the first damage region 220 may be unstable. Thus, the first damage region 220 may be easily removed from the pattern structure 205 by an external impact.

Meanwhile, after the etching process, an etch residue RSD may remain on the surface of the recess region RC of the pattern structure 205.

Figure 5:
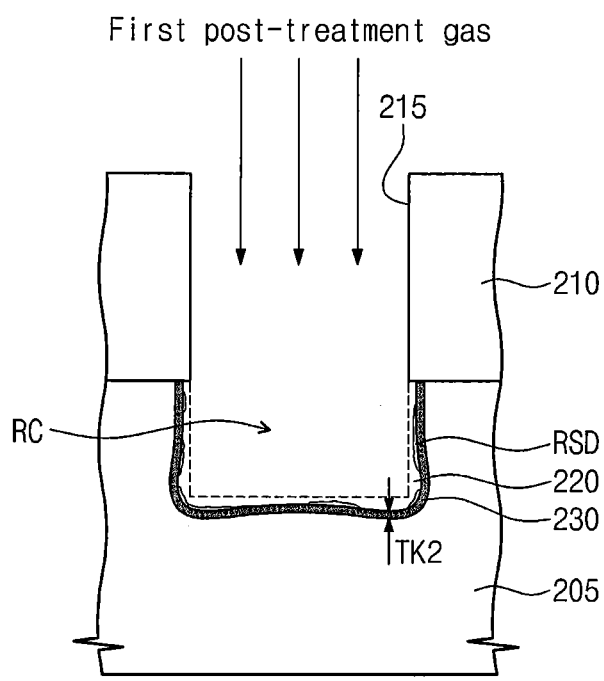

Referring to FIGS. 2 and 5, a first post-etch treatment process may be performed (S120). In some embodiments, the first post-etch treatment process may be performed in-situ in the chamber 100 of FIG. 1 in which the etching process is performed. In certain embodiments, the first post-etch treatment process may not be performed in the chamber in which the etching process is performed.

The first post-etch treatment process may be a process of removing the first damage region 220. In some embodiments, a first post-treatment gas may be injected into the process chamber 100 of FIG. 1, and plasma may be then generated to perform the first post-etch treatment process. The first post-etch treatment process using the plasma may be defined as a first post-etch plasma treatment process. Ions of the first post-treatment gas may be sputtered to the surface of the pattern structure 205 having the first damage region 220 damaged by the etching process. The sputtered ions may collide with the first damage region 220 to remove the first damage region 220 and the etch residue RSD from the pattern structure 205.

The etch residue RSD may be first removed by the first post-treatment gas. Subsequently, the first damage region 220 may be removed by the first post-treatment gas. The process of removing the first damage region 220 will be described in more detail hereinafter.

According to some embodiments of the inventive concepts, a kind and/or a flow rate of the first post-treatment gas may be controlled to adjust a collision depth of the plasma ions of the first post-treatment gas. The collision depth of the ions of the first post-treatment gas may be substantially equal to the first thickness TK1.

In some embodiments, it may be preferable to remove only the first damage region 220. However, the thickness of the region damaged by the etching process may vary according to the position in the damaged region as described above, and thus a portion of the pattern structure 205, which is not damaged by the etching process, may be damaged by the ions of the first post-treatment gas. In addition, process variables may occur during the first post-etch treatment process, and the first post-etch treatment process may be performed in consideration of the process variables. Thus, the first post-etch treatment process may be performed to the non-damaged portion of the pattern structure 205 as well as the first damage region 220. As a result, a surface of the recess region RC of the pattern structure 205 may be partially damaged by the first post-etch treatment process. Hereinafter, the portion damaged by the ions of the first post-treatment gas may be defined as a second damage region 230 for the purpose of ease and convenience in explanation. In addition, a thickness of the second damage region 230 may vary according to a position in the second damage region 230. As described above, a thickness of the thickest portion of the second damage region 230 may be defined as the thickness of the second damage region 230 for the purpose of ease and convenience in explanation. The thickness of the second damage region 230 may be defined as a second thickness TK2. The second thickness TK2 may correspond to a distance from a bottom surface of the second damage region 230 to the surface of the recess region RC from which the first damage region 220 is removed.

In certain embodiments, the first post-etch treatment process may remove only the first damage region 220. In this case, the second damage region 230 may not be generated. However, an etch residue RSD may remain during the first post-etch treatment process, and thus a second post-etch treatment process may be subsequently performed.

In some embodiments, the collision depth of the ions may be adjusted using a polarity of the ions of the first post-treatment gas and a polarity of bias power applied to the stage 110 (FIG. 1). In detail, the polarity of the ions of the first post-treatment gas in the plasma state may be the same as the polarity of the bias power applied to the stage 110 by the bias power unit 115 of FIG. 1. Since the polarity of the ions is the same as the polarity of the bias power applied to the stage 110, repulsive force may be generated between the stage 110 and the ions to reduce the amount of the ions penetrating the surface of the recess region RC of the pattern structure 205 or to reduce a penetration depth of the ions. Thus, it is possible to reduce the second thickness TK2 of the second damage region 230 damaged by the ions of the first post-treatment gas. In some embodiments, the first post-treatment gas may include a carbon-free gas. The first post-treatment gas may include at least one selected from halogen elements such as fluorine (F), chlorine (Cl), and bromine (Br). For example, the first post-treatment gas may include at least one of $SF_6$, HBr, $NF_3$, or $Cl_2$.

In some embodiments, the collision depth of the ions of the first post-treatment gas may be adjusted using characteristics of the first post-treatment gas. For example, the first post-treatment gas may include atoms or molecules that have a small collision force when converted into ions by plasma power. Thus, even though the ions of the first post-treatment gas collide with the surface of the recess region RC of the pattern structure 205, they may not deeply penetrate the pattern structure 205. The second thickness TK2 of the second damage region 230 may be reduced by this characteristic of the first post-treatment gas, and thus it is possible to inhibit the surface of the pattern structure 205 from being damaged.

In FIG. 5, the first damage region 220 is completely removed. However, embodiments of the inventive concepts are not limited thereto. In certain embodiments, a portion of the first damage region 220 may remain after the first post-etch treatment process. In addition, the portion of the pattern structure 205, which is not damaged by the etching process and is disposed under the first damage region 220, may be partially removed.

In some embodiments, the ions (e.g., $C^+$, $Cl^-$, and/or $F^-$) may generate the residue RSD (i.e., a contaminant) on the surface of the recess region RC of the pattern structure 205 during the first post-etch treatment process. The residue RSD may remain on a surface of the second damage region 230. The residue RSD may act as a defect in a semiconductor device to be completed later, and thus reliability of the semiconductor device may be deteriorated.

Figure 6:
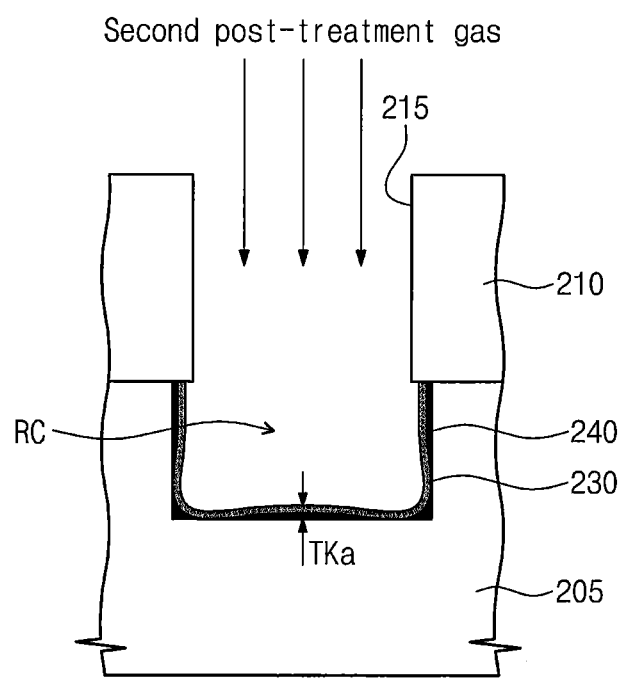

Referring to FIGS. 2 and 6, a second post-etch treatment process may be performed (S130). In some embodiments, the second post-etch treatment process may be performed in-situ in the chamber in which the first post-etch treatment process is performed. In certain embodiments, the second post-etch treatment process may be performed in a chamber different from the chamber in which the first post-etch treatment process is performed.

As described with reference to FIGS. 2 and 5, after the first post-etch treatment process, the second damage region 230 may be formed on the surface of the pattern structure 205 and the residue RSD may remain. The second post-etch treatment process may damage the second damage region 230 and remove the residue RSD by means of a second post-treatment gas not having reactivity.

In some embodiments, the second post-treatment gas may be provided into the process chamber 100 of FIG. 1 and then plasma may be generated to perform the second post-etch treatment process. The second post-etch treatment process using the plasma may be defined as a second post-etch plasma treatment process. In some embodiments, the second post-treatment gas may include an inert gas. For example, the second post-treatment gas may include at least one of helium (He), argon (Ar), or nitrogen ($N_2$).

The residue remaining on the surface of the pattern structure 205 may be physically detached and removed during the second post-etch treatment process. In addition, since the second post-etch treatment process uses the plasma of the inert gas, the second damage region 230 may be physically damaged but an additional residue (i.e., an additional contaminant) may not be generated. Bonds between atoms and/or molecules in the second damage region 230 may be weak or broken by the physical damage of the second post-etch treatment process.

In some embodiments, it may be preferable to damage only the second damage region 230 in the second post-etch treatment process. However, the second thickness TK2 of the second damage region 230 may be varied according to a position on the surface of the pattern structure 205, and process variables may occur during the second post-etch treatment process. Thus, the second post-etch treatment process may be performed to a non-damaged portion of the pattern structure 205 as well as the second damage region 230 in consideration of the non-uniform thickness TK2 of the second damage region 230 and the process variables of the second post-etch treatment process.

In other words, a portion of the pattern structure 205 disposed under the second damage region 230 may also be damaged by the second post-etch treatment process, and the damaged portion under the second damage region 230 may be defined as a third damage region 240. The third damage region 240 may surround the second damage region 230. A thickness of the third damage region 240 may be varied according to a position on the surface of the recess region RC of the pattern structure 205. However, as described above, a thickness of the thickest portion of the third damage region 240 may be defined as the thickness of the third damage region 240 for the purpose of ease and convenience in explanation. The thickness of the third damage region 240 may be defined as a third thickness. A sum TKa of the thicknesses of the second and third damage regions 230 and 240 damaged by the second post-etch treatment process may be a distance from a bottom surface of the third damage region 240 to the surface of the recess region RC from which the first damage region 220 is removed. The sum TKa of the thicknesses of the second and third damage regions 230 and 240 may be greater than the second thickness TK2.

In certain embodiments, the second post-etch treatment process may damage only the second damage region 230. In this case, the third damage region 240 may not be formed.

Figure 7:
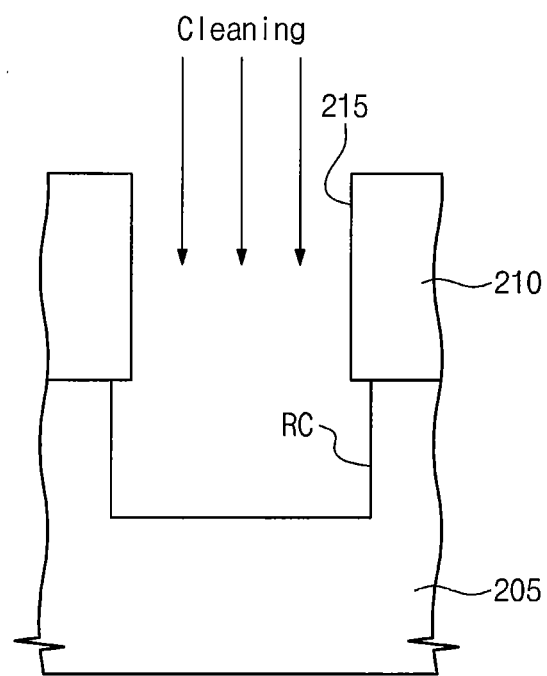

Referring to FIGS. 2 and 7, a cleaning process may be performed to remove the second and third damage regions 230 and 240 (S140).

According to some embodiments of the inventive concepts, the second and third damage regions 230 and 240 may be removed by only a strip process without an ashing process.

In general, a by-product of a plasma process may be removed by an ashing process and a strip process. However, according to some embodiments of the inventive concepts, the second damage region 230 may be damaged by the ions of the first and second post-treatment gases, and the third damage region 240 may be damaged by the ions of the second post-treatment gas. In other words, the bonds between the atoms and/or molecules in the second and third damage regions 230 and 240 may be weak or broken, and thus the second and third damage regions 230 and 240 may be easily removed from the pattern structure 205 by only the strip process.

According to some embodiments of the inventive concepts, the cleaning process may include at least one of a wet cleaning process or a dry cleaning process. As described above, since the second and third damage regions 230 and 240 are damaged by the ions of the first and second post-treatment gases, the bonds in the second and third damage regions 230 and 240 may be weak or broken. As a result, the second and third damage regions 230 and 240 may be easily removed by the wet or dry cleaning process.

The recess region RC of the pattern structure 205 may be filled with at least one of various materials, thereby realizing one of various semiconductor devices.

Figure 8:
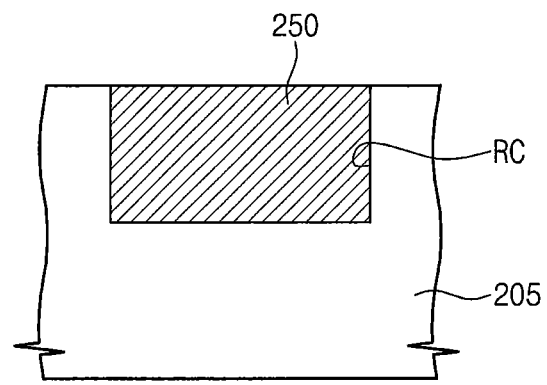

According to an embodiment illustrated in FIG. 8, a semiconductor device including a contact plug (or an interconnection) 250 may be manufactured by filling the recess region RC of the pattern structure 205 with a conductive material. If a damaged region exists between the pattern structure 205 and the contact plug (or the interconnection) 250, a leakage current may be generated through the damaged region. However, according to some embodiments of the inventive concepts, the damage regions may be removed, and thus it is possible to prevent electrical characteristics of the semiconductor device from deteriorating.

Figure 9:
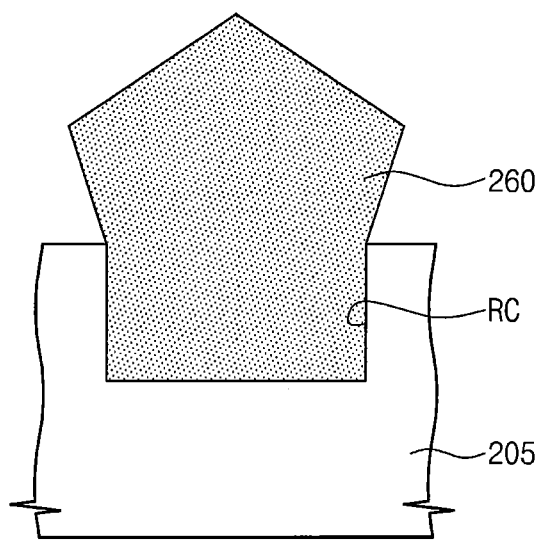

According to an embodiment illustrated in FIG. 9, an epitaxial process may be performed on the pattern structure 205 to manufacture a semiconductor device including an epitaxial pattern 260. Even though not shown in the drawings, a seed layer may be formed along an inner surface of the recess region RC of the pattern structure 205. If a damaged region exists between the pattern structure 205 and the epitaxial pattern 260, a leakage current may be generated through the damaged region. However, according to some embodiments of the inventive concepts, the damage regions may be removed, and thus it is possible to prevent electrical characteristics of the semiconductor device from deteriorating.

Embodiments of the inventive concepts are not limited to the embodiments described with reference to FIGS. 8 and 9.

Figure 10:
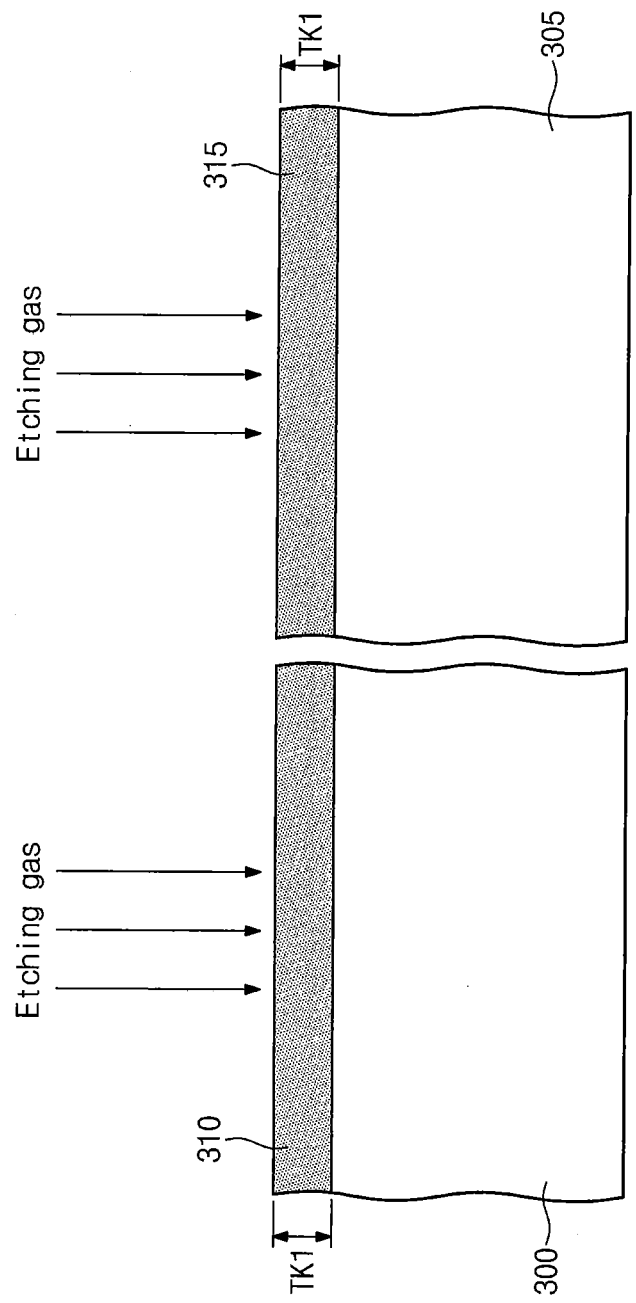
FIGS. 10 to 13 are cross-sectional views illustrating a method of treating a layer according to a comparative example and a method of treating a layer according to some embodiments of the inventive concepts.

FIGS. 10 to 13 are cross-sectional views illustrating a method of treating a layer according to a comparative example and a method of treating a layer according to some embodiments of the inventive concepts. In FIGS. 10 to 13, left views illustrate the method of treating a layer according to the comparative example and right views illustrate the method of treating a layer according to some embodiments of the inventive concepts. Referring to FIG. 10, when an etch target layer 305 according to some embodiments of the inventive concepts and a general etch target layer 300 are plasma-etched using a $CF_4$ gas, first damage regions 310 and 315 may be formed on the general etch target layer 300 and the etch target layer 305 according to some embodiments, respectively. The first damage regions 310 and 315 may have a first damage thickness TK1. Bonds in each of the first damage regions 310 and 315 may be weak or broken.

Figure 11:
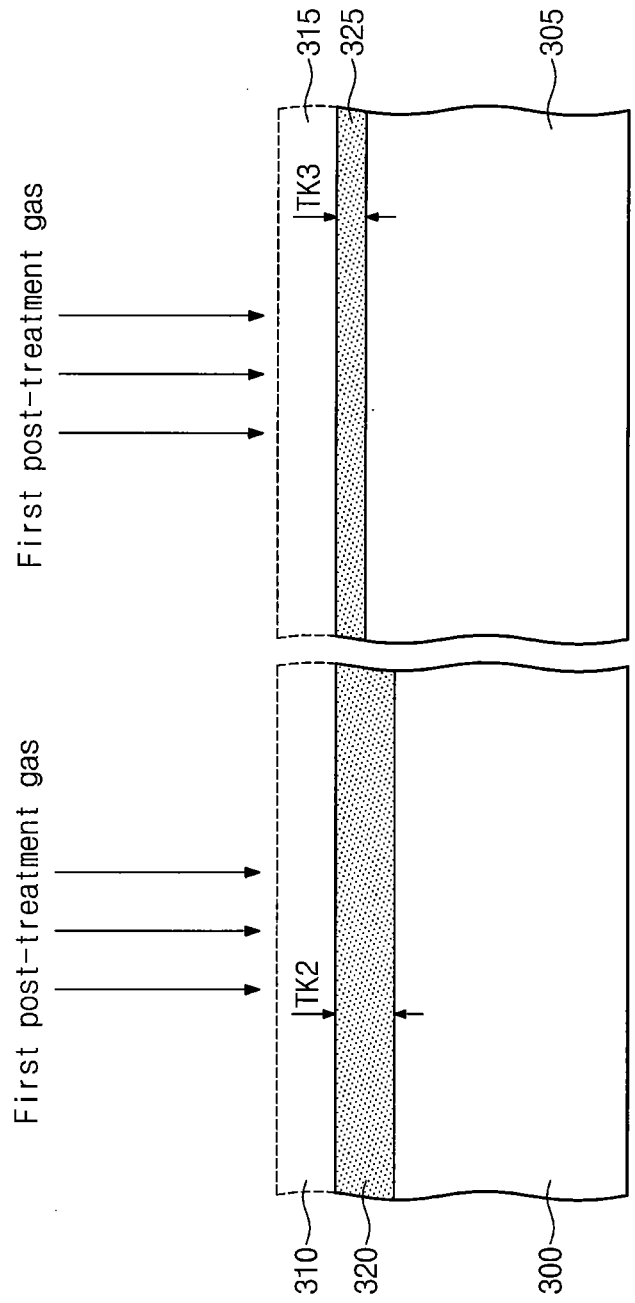

Referring to the left view of FIG. 11, a first post-etch treatment process may be performed on a surface of the general etch target layer 300, according to the comparative example. The first general post-etch treatment process performed on the general etch target layer 300 may use the same gas as an etching gas used in the etching process. In detail, during first general post-etch treatment process performed on the general etch target layer 300, the $CF_4$ gas may be used and a negative bias may be applied to a stage on which the general etch target layer 300 is loaded. The $CF_4$ gas may be decomposed into $C^+$, $F^-$, $CF_3$, and F. The decomposed elements may collide with a surface of the general etch target layer 300 on which the first damage region 310 is formed, thereby removing the first damage region 310. However, the decomposed elements may penetrate the first damage region 310 and may permeate into the general etch target layer 300 disposed under the first damage region 310 to form a second damage region 320. In particular, $C^+$ may deeply permeate into the general etch target layer 300 because of its low atomic weight and an attractive force between $C^+$ and the stage having the negative bias. A portion including $C^+$ may act as a contamination layer to deteriorate electrical reliability of a semiconductor device to be completed. The second damage region 320 may have a second damage thickness TK2. The second damage thickness TK2 may be a distance from a bottom surface of the second damage region 320 to a surface of the general etch target layer 300 from which the first damage region 310 is removed.

Referring to the right view of FIG. 11, the first post-etch treatment process according to the inventive concepts may be performed on the etch target layer 305. The first post-etch treatment process according to the inventive concepts may be performed by the plasma process using the $Cl_2$ gas. In addition, a negative bias may be applied to the stage on which the etch target layer 305 is loaded. The $Cl_2$ gas may be decomposed into radical Cl* and/or negative ions CF in a plasma state. The decomposed elements may collide with a surface of the etch target layer 305 to remove the first damage region 315. However, the decomposed elements may penetrate the first damage region 315 and may also permeate into the etch target layer 305 disposed under the first damage region 315 to form a third damage region 325. According to some embodiments of the inventive concepts, a repulsive force may be generated between CF and the stage having the negative bias, and thus the third damage region 325 may have a third damage thickness TK3 smaller than the second damage thickness TK2.

Figure 12:
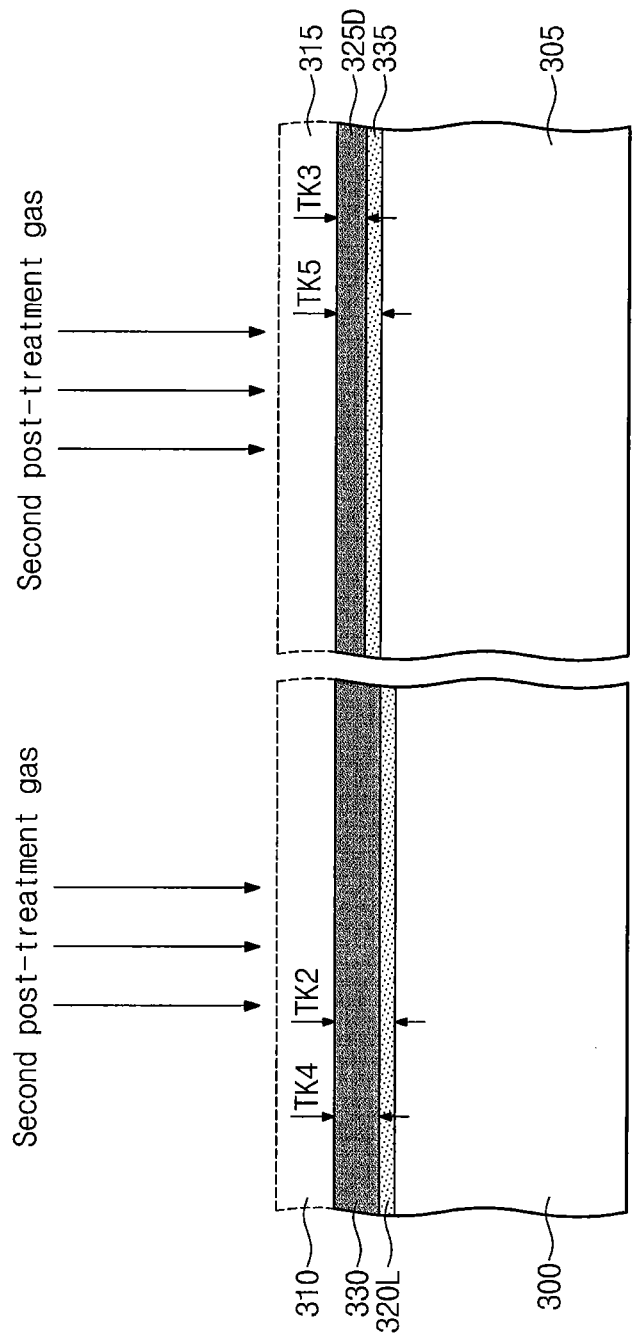

Referring to the left view of FIG. 12, a second post-etch treatment process may be performed on the second damage region 320 of FIG. 11. In general, the second post-etch treatment process may not be included in a general treatment process performed after an etching process. However, the second post-etch treatment process is performed on the general etch target layer 300 according to the comparative example to check characteristics relative to the first post-etch treatment process according to some embodiments of the inventive concepts.

In detail, a plasma process using an inert gas (e.g., an argon gas) may be performed to physically damage the second damage region 320 by a physical impact. At this time, a portion damaged by the second post-etch treatment process may have a fourth damage thickness TK4 smaller than the second damage thickness TK2. This may be because the second damage region 320 is deeply formed by the $C^+$ having the low atomic weight and the attractive force between the $C^+$ and the stage having the negative bias during the general first post-etch treatment process but the inert gas shallowly permeates into the etch target layer 300 during the second post-etch treatment process.

The portion of the etch target layer 300, which is damaged by the second post-etch treatment process, may be defined as a fourth damage region 330. The fourth damage region 330 may be included in an upper portion of the second damage region 320. The fourth damage region 330 may have the fourth damage thickness TK4 from a top surface of the etch target layer 300 to a bottom surface of the fourth damage region 330.

Only an upper portion (i.e., the fourth damage region 330) of the second damage region 320 may be damaged by the second post-etch treatment process. Bonds in the upper portion (i.e., the fourth damage region 330) of the second damage region 320 may be weak or broken, and thus the upper portion of the second damage region 320 may be easily removed by a subsequent cleaning process. However, it may be difficult to remove a lower portion 320L of the second damage region 320, which is not damaged by the second post-etch treatment process.

Referring to the right view of FIG. 12, a second post-etch treatment process may be performed on the third damage region 325 of FIG. 11. In detail, the second post-etch treatment process may be the substantially same as the second post-etch treatment process described with reference to the left view of FIG. 12. In other words, the plasma process using the inert gas (e.g., an argon gas) may be performed to physically damage the third damage region 325 by the physical impact. A reference designator 325D in the right view of FIG. 12 indicates the third damage region 325D damaged by the second post-etch treatment process. In addition, a fifth damage region 335 may be formed under the third damage region 325D by the second post-etch treatment process. The portion damaged by the second post-etch treatment process may have a fifth damage thickness TK5 from a top surface of the etch target layer 305 to a bottom surface of the fifth damage region 335. The fifth damage thickness TK5 may be greater than the third damage thickness TK3 and may be substantially equal to the fourth damage thickness TK4.

The third damage region 325D may be more damaged by the second post-etch treatment process. In addition, since the second post-etch treatment process is performed using the inert gas, the fifth damage region 335 may not be contaminated.

Figure 13:
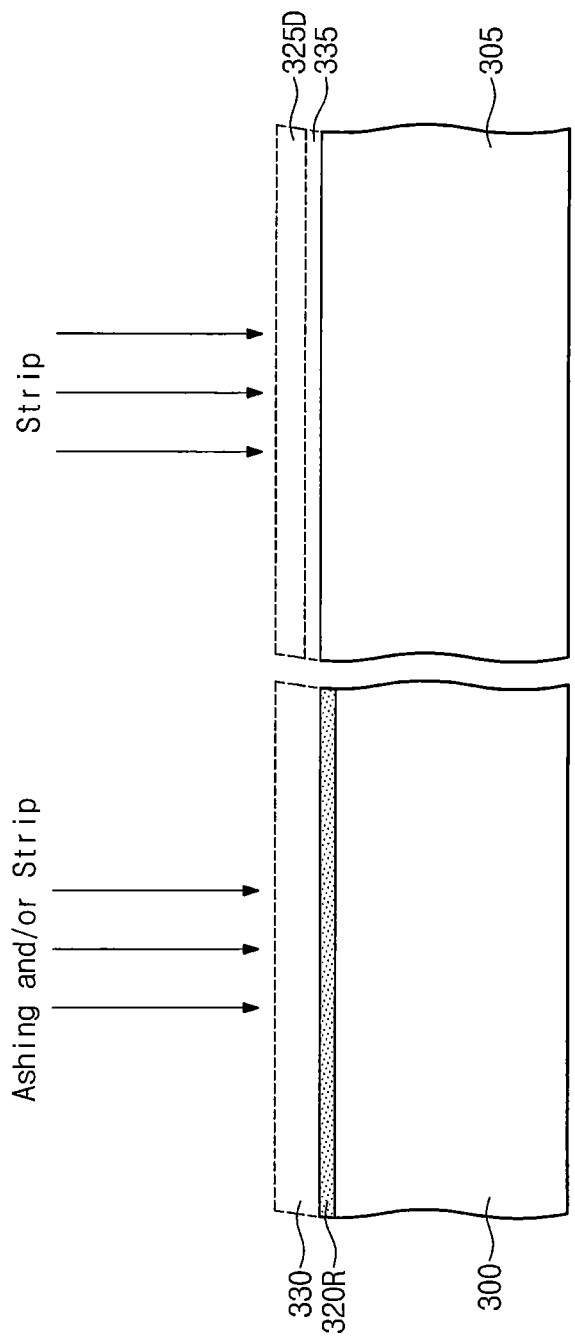

Referring to the left view of FIG. 13, a cleaning process may be performed on the fourth damage region 330 (i.e., the upper portion of the second damage region). The cleaning process may include an ashing process and a strip process. During the cleaning process, the fourth damage region 330 may be removed but the lower portion 320L of the second damage region which is not damaged by the second post-etch treatment process may not be completely removed by $C^+$, $F^-$, $CF_3$, and/or F remaining therein. The second damage region 320R which is not removed may deteriorate electrical reliability of a semiconductor device to be completed.

Referring to the right view of FIG. 13, the cleaning process according to inventive concepts may be performed. The cleaning process may be performed using a strip process without an ashing process. The third and fifth damage regions 325D and 335 physically damaged may be removed by the cleaning process.

Figure 14:
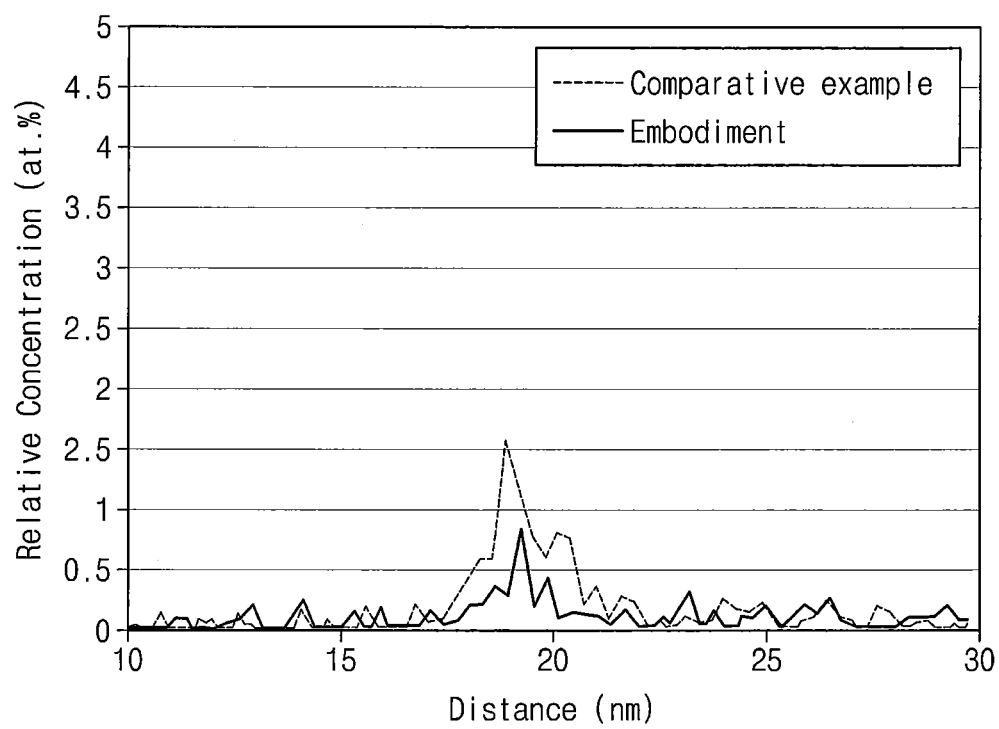
FIG. 14 is a graph comparing a carbon amount of a surface of a pattern structure formed by a method of manufacturing a semiconductor device according to some embodiments of the inventive concepts with a carbon amount of a surface of a pattern structure formed by a method of manufacturing a semiconductor device according to a comparative example.

FIG. 14 is a graph comparing a carbon amount of a surface of a pattern structure formed by a method of manufacturing a semiconductor device according to some embodiments of the inventive concepts with a carbon amount of a surface of a pattern structure formed by a method of manufacturing a semiconductor device according to a comparative example.

Referring to FIG. 14, the carbon amount of the surface of the pattern structure formed according to some embodiments of the inventive concepts is equal to or less than a half of the carbon amount of the surface of the pattern structure formed according to the comparative example. In other words, according to some embodiments of the inventive concepts, during the first post-etch treatment process, the carbon-free gas may be used, the polarity of the stage may be the same as the polarity of the ions of the first post-treatment gas, and/or the gas having a low penetration property may be used. As a result, the carbon amount of the pattern structure formed according to the inventive concepts may be reduced.

According to some embodiments of the inventive concepts, the first post-etch plasma treatment process may be performed using the first post-treatment gas on the plasma-etched etch target layer, and the second post-etch plasma treatment process may be performed using the inert gas to completely remove the damage region of the surface of the etch target layer. In some embodiments, the polarity of the ions of the first post-treatment gas may be the same as the polarity of the stage in the plasma apparatus. The damage region may be completely removed, and thus it is possible to prevent the electrical characteristics of the semiconductor device from deteriorating.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of treating a layer, the method comprising:
   loading an etch target layer on a stage in a plasma apparatus;
   plasma-etching the etch target layer using an etching gas injected into the plasma apparatus, wherein a first damage region having a first thickness is generated on a surface of the etch target layer during the plasma-etching of the etch target layer;
   performing a first post-etch plasma treatment process using a first post-treatment gas to remove the first damage region, wherein a second damage region is generated on a surface of the etch target layer, from which the first damage region is removed, during the first post-etch plasma treatment process;
   performing a second post-etch plasma treatment process using a second post-treatment gas to damage the second damage region; and
   performing a cleaning process to remove the second damage region damaged by the second post-etch treatment process.

2. The method of claim 1, wherein a polarity of ions of the first post-treatment gas in a plasma state is the same as a polarity of bias power applied to the stage during the first post-etch plasma treatment process.

3. The method of claim 1, wherein the plasma-etching, the first post-etch plasma treatment process, and the second post-etch plasma treatment process are performed in-situ in the plasma apparatus.

4. The method of claim 1, wherein at least two of the plasma-etching, the first post-etch plasma treatment process, and the second post-etch plasma treatment process are performed in-situ in the plasma apparatus.

5. The method of claim 1, wherein the first post-treatment gas comprises a carbon-free gas.

6. The method of claim 1, wherein the first post-treatment gas comprises $Cl_2$.

7. The method of claim 1, wherein the second post-treatment gas comprises an inert gas.

8. The method of claim 1, wherein a third damage region is generated under the damaged second damage region during the second post-etch plasma treatment process, and
wherein the second and third damage regions are removed by the cleaning process.

9. The method of claim 1, wherein the cleaning process comprises a strip process.

10. The method of claim 1, wherein the cleaning process comprises at least one of a wet cleaning process or a dry cleaning process.

11. The method of claim 1, further comprising:
forming a conductive layer on the etch target layer after the performing of the cleaning process.

12. The method of claim 1, further comprising:
performing an epitaxial process on the etch target layer to form an epitaxial layer after the performing of the cleaning process.

13. A method of treating a layer, the method comprising:
loading an etch target layer on a stage in a plasma apparatus;
plasma-etching the etch target layer using a fluorine-containing etching gas injected into the plasma apparatus, wherein a first damage region is formed on a surface of the etch target layer, the first damage region having a first thickness;
performing a first post-etch plasma treatment process using a chlorine-containing gas to remove the first damage region, wherein a second damage region is formed on a surface of the etch target layer from which the first damage region is removed, the second damage region having a second thickness;
performing a second post-etch plasma treatment process using an inert gas to damage the second damage region; and
performing a cleaning process to remove the second damage region damaged by the second post-etch plasma treatment process,
wherein at least two of the plasma-etching, the first post-etch plasma treatment process, and the second post-etch plasma treatment process are performed in-situ in the plasma apparatus.

14. The method of claim 13, wherein a third damage region is generated under the damaged second damage region during the second post-etch plasma treatment process, and
wherein the second and third damage regions are removed by the cleaning process.

15. The method of claim 13, wherein the cleaning process comprises at least one of a strip process, a wet cleaning process, or a dry cleaning process.

16. A method of manufacturing a semiconductor device, the method comprising:
etching a target layer to form a pattern structure in the target layer, wherein a first damage region having a first thickness is generated on a surface of the pattern structure;
performing a first post-etch plasma treatment process using a first post-treatment gas to remove the first damage region, wherein a second damage region is generated on a surface of the pattern structure from which the first damage region is removed;
performing a second post-etch plasma treatment process using a second post-treatment gas to damage the second damage region; and
performing a cleaning process to remove the second damage region damaged by the second post-etch treatment process.

17. The method of claim 16, wherein the first post-treatment gas comprises a carbon-free gas, and wherein the second post-treatment gas comprises an inert gas.

18. The method of claim 16, wherein a third damage region is generated under the damaged second damage region during the second post-etch plasma treatment process, and wherein the second and third damage regions are removed by the cleaning process.

19. The method of claim 16, wherein the cleaning process comprises at least one of a strip process, a wet cleaning process, or a dry cleaning process.

20. The method of claim 16, further comprising forming a conductive layer on the surface of the pattern structure after the performing of the cleaning process.

* * * * *